(12) United States Patent
Araki

(10) Patent No.: US 10,090,778 B2
(45) Date of Patent: Oct. 2, 2018

(54) MULTI-PHASE POWER DEVICE WITH TWO-PHASE MODULATION SCHEME

(71) Applicant: Fuji Electric Co., Ltd., Kanagawa (JP)

(72) Inventor: Ryu Araki, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/863,715

(22) Filed: Jan. 5, 2018

(65) Prior Publication Data

US 2018/0234032 A1  Aug. 16, 2018

(30) Foreign Application Priority Data

Feb. 16, 2017  (JP) ................................ 2017-026726

(51) Int. Cl.

| | |
|---|---|
| *H02M 7/538* | (2007.01) |
| *H02M 7/5387* | (2007.01) |
| *H02P 27/08* | (2006.01) |
| *H02M 1/088* | (2006.01) |
| *H01L 29/16* | (2006.01) |
| *H02M 1/00* | (2006.01) |

(52) U.S. Cl.
CPC ....... *H02M 7/53871* (2013.01); *H02M 1/088* (2013.01); *H02P 27/08* (2013.01); *H01L 29/1608* (2013.01); *H02M 2001/0009* (2013.01); *H02M 2001/0054* (2013.01)

(58) Field of Classification Search
CPC ......... H02M 1/088; H02M 2001/0009; H02M 2001/0054; H02P 27/08; H01L 29/1608
See application file for complete search history.

(56) References Cited

U.S. PATENT DOCUMENTS

| | | | |
|---|---|---|---|
| 9,680,380 B2* | 6/2017 | Akiyama | ............... H02M 3/158 |
| 2013/0016542 A1* | 1/2013 | Nakamura | ........... H03K 17/163 |
| | | | 363/56.01 |
| 2013/0207123 A1* | 8/2013 | Henning | ............. H01L 29/7806 |
| | | | 257/77 |
| 2013/0248883 A1* | 9/2013 | Das | ..................... H01L 29/7806 |
| | | | 257/77 |
| 2015/0085548 A1* | 3/2015 | Takao | ................... H02M 3/155 |
| | | | 363/131 |
| 2015/0207429 A1* | 7/2015 | Akiyama | ............... H02M 1/088 |
| | | | 363/131 |
| 2015/0222201 A1* | 8/2015 | Nakashima | ........... H02M 7/487 |
| | | | 363/131 |

(Continued)

FOREIGN PATENT DOCUMENTS

| | | |
|---|---|---|
| JP | 2012-249488 A | 12/2012 |
| JP | 2013-223357 A | 10/2013 |

*Primary Examiner* — Yusef A Ahmed
(74) *Attorney, Agent, or Firm* — Chen Yoshimura LLP

(57) ABSTRACT

A multi-phase power device for driving an inductive load includes a first semiconductor device and a second semiconductor device connected in series in each of three phase arms. Each first semiconductor device includes a first switching device made of a wide-bandgap semiconductor and a freewheeling diode that is made of a narrow-bandgap semiconductor and is connected in anti-parallel to the first switching devices. Each second semiconductor device includes a second switching devices made of a wide-bandgap semiconductor and a freewheeling diode connected in anti-parallel to the second switching device.

8 Claims, 7 Drawing Sheets

(56) References Cited

U.S. PATENT DOCUMENTS

| | | | |
|---|---|---|---|
| 2015/0236603 A1* | 8/2015 | Jimichi | H02M 5/293 |
| | | | 363/37 |
| 2016/0079892 A1* | 3/2016 | Arafat | H02M 1/32 |
| | | | 318/400.28 |
| 2016/0164413 A1* | 6/2016 | Akiyama | H03K 17/04206 |
| | | | 323/271 |
| 2017/0077835 A1* | 3/2017 | Hirakata | H02M 1/08 |
| 2017/0194954 A1* | 7/2017 | Chen | H03K 17/0826 |
| 2017/0213811 A1* | 7/2017 | Das | H01L 25/072 |
| 2017/0324316 A1* | 11/2017 | Araki | H02M 1/08 |
| 2018/0019309 A1* | 1/2018 | Radhakrishnan | H01L 29/1608 |
| 2018/0040593 A1* | 2/2018 | Zhou | H01L 25/071 |

\* cited by examiner

MULTI-PHASE POWER DEVICE WITH TWO-PHASE MODULATION SCHEME

BACKGROUND OF THE INVENTION

Technical Field

The present invention relates to power devices for use in a power converter or the like and one or more of components thereof.

Background Art

Inverters are conventionally used as power converters for driving single-phase motors and three-phase motors. Such inverter circuits utilize a semiconductor device in which a first semiconductor device and a second semiconductor device are connected in series.

In inverters in which a plurality of phases of series-connected first semiconductor devices and second semiconductor devices are connected in parallel, the same type of semiconductor switching device (such as an Si metal-oxide-semiconductor field-effect transistor (MOSFET) or insulated-gate bipolar transistor (IGBT)) is typically used for the first semiconductor devices that form upper arms and the second semiconductor devices that form lower arms.

In recent years, wide-bandgap semiconductors such as SiC have been used in semiconductor switching devices which exhibit lower losses than with Si, the semiconductor devices constituting the upper and lower arms are each configured using an SiC MOSFET and an external SiC SBD as a freewheeling diode, and wide-bandgap semiconductors are used in all of the semiconductor devices in order to reduce losses. However, in this case, it becomes a challenge to inhibit increases in cost.

Moreover, inverter control schemes for driving these semiconductor devices include two-phase modulation inverter control schemes in which in the phase voltages of a three-phase voltage applied to the motor, each phase voltage is periodically fixed by switching ON a switching device in the upper arms and switching OFF the corresponding switching device in the lower arms in order every $2\pi/3$ (see Patent Document 1, for example).

Two-phase modulation schemes can be divided into upper-clamped schemes and lower-clamped schemes based on differences between the control schemes employed, and each type of control scheme yields different loss balancing characteristics in the upper and lower arms. For example, in lower-clamped schemes, the switching devices in the upper arms exhibit high switching loss, and the switching devices in the lower arms exhibit high conduction loss. Furthermore, the freewheeling diodes in the upper arms exhibit substantially no conduction loss, while the freewheeling diodes in the lower arms exhibit high switching loss. In upper-clamped schemes, these characteristics are reversed.

Therefore, when the same type of semiconductor device is used in the upper arms and the lower arms, the resulting loss balancing between upper arms and the lower arms is poor, the semiconductor devices in either the upper arms or the lower arms exhibit high losses, and the total loss is large. Moreover, the allowable output is limited by the semiconductor devices in either the upper arms or the lower arms. Furthermore, at high operation speeds, there is a problematic increase in noise during switching.

In addition, in light of this increase in noise that occurs when the same type of semiconductor device is used for both the upper and lower arms, one proposed method of reducing losses involves using SiC semiconductor switching devices for one of the upper and lower arms and using Si semiconductor switching devices for the other in order to focus on switching loss when switching the SiC semiconductor switching devices ON and OFF and focus on switching noise when switching the Si semiconductor switching devices ON and OFF, for example (see Patent Document 2, for example).

RELATED ART DOCUMENT

Patent Document

Patent Document 1: Japanese Patent Application Laid-Open Publication No. 2012-249488

Patent Document 2: Japanese Patent Application Laid-Open Publication No. 2013-223357

SUMMARY OF THE INVENTION

In the conventional example described in Patent Document 2, a voltage source bridge circuit is formed having an upper/lower arm configuration in which a first pair of devices constituted by a switching device made of a wide-bandgap semiconductor and a freewheeling diode made of a narrow-bandgap semiconductor, which are connected in anti-parallel, is connected in series to a second pair of devices constituted by a switching device made of a narrow-bandgap semiconductor and a freewheeling diode made of a wide-bandgap semiconductor, which are connected in anti-parallel. In other words, this configuration makes it possible to maintain reliability against thermal breakdown, inhibit increases in cost, and prevent increases in noise to a greater extent than a configuration in which all of the semiconductor devices are made of a wide-bandgap semiconductor.

However, if the frequency at which the switching devices in the upper and lower arms are switched ON and OFF is the same, it is only possible to take advantage of roughly half the full extent of the low switching loss properties of the deliberately utilized SiC semiconductor switching devices.

Moreover, when the switching devices in the upper arms are MOSFETs, for example, depending on the relationship of magnitude between the forward voltage VF of the body diodes of the MOSFETs and the forward voltage VF of the freewheeling diodes connected in anti-parallel to these switching devices in the upper arms, freewheeling current can potentially flow through the body diodes of the MOSFETs in the upper arms, in which case it is not possible to fully realize the low noise effect gained from the soft recovery of the external freewheeling diodes aiming at reducing noise.

Furthermore, given the demand for increasingly low-loss power converters in recent years, it is desirable that SiC semiconductor switching devices be used for the switching devices in both the upper and lower arms.

Therefore, the present invention was made in view of the problems in the conventional examples described above and aims to provide a semiconductor device which makes it possible to inhibit increases in noise, reduce total loss, and improve loss imbalances in switching devices and freewheeling diodes in the upper arms and lower arms of an inverter circuit driven using a two-phase modulation scheme.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a power device for driving an inductive load to be connected thereto, including: a bridge circuit in which three switching arms corresponding to three phases are connected in parallel, each switching arm including a first semiconductor device in one of an upper arm and a lower arm thereof and a second semiconductor device in the other of the upper arm and the lower arm that is connected in series to the first semiconductor device; and a gate driver that switches ON and OFF the first semiconductor devices and the second semiconductor devices of the respective switching arms of the bridge circuit so as to drive the inductive load to be connected to the bridge circuit, wherein each of the first semiconductor devices includes a first switching device made of a wide-bandgap semiconductor and a freewheeling diode that is made of a narrow-bandgap semiconductor and is connected in anti-parallel to the first switching device, wherein each of the second semiconductor devices includes a second switching device made of a wide-bandgap semiconductor and a freewheeling diode connected in anti-parallel to the second switching device, and wherein the gate driver is configured to turn ON and OFF the respective first and second switching devices so as to drive the inductive load in a two-phase modulation scheme in which in every 2π/3 phase period, one of phase voltages of three-phase voltages applied to the inductive load is alternately fixed to a constant voltage by controlling one of the upper arm and the lower arm of each switching arm of the bridge circuit to an ON state and controlling the other of the upper arm and the lower arm of each switching arm of the bridge circuit to an OFF state.

In another aspect, the present disclosure provides a semiconductor device including a first semiconductor device and a second semiconductor device connected in series, wherein the first semiconductor device includes a first switching device made of a wide-bandgap semiconductor and a freewheeling diode that is made of a narrow-bandgap semiconductor and is connected in anti-parallel to the first switching device, and wherein the second semiconductor device includes a second switching device made of a wide-bandgap semiconductor and a freewheeling diode connected in anti-parallel to the second switching device.

One aspect of the present invention makes it possible to inhibit increases in noise, reduce total loss, and improve loss imbalances in switching devices and freewheeling diodes in the upper arm and lower arm of an inverter circuit driven using a two-phase modulation scheme. The low loss effect is particularly pronounced when operating under moderate load.

It is to be understood that both the foregoing general description and the following detailed description are exemplary and explanatory, and are intended to provide further explanation of the invention as claimed.

DETAILED DESCRIPTION OF EMBODIMENTS

Figure 1:
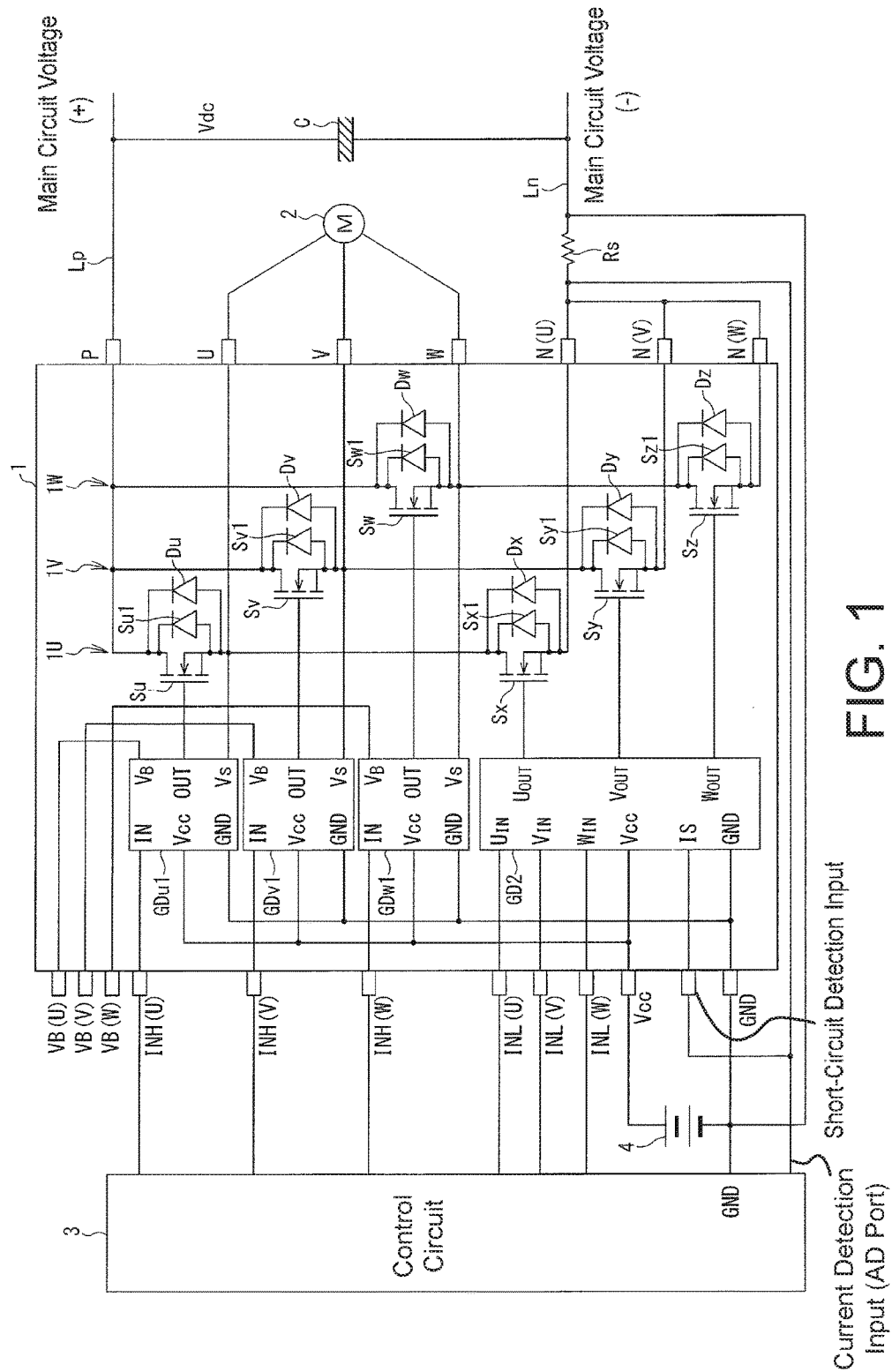
FIG. 1 is a circuit diagram illustrating an example of an intelligent power module to which the present invention has been applied.

Next, embodiments of the present invention will be described with reference to figures. In the following descriptions of the figures, the same or similar reference characters are used for components that are the same or similar.

Moreover, the embodiments described below are only examples of devices or methods for implementing the technical concept of the present invention, and the technical concept of the present invention does not limit the materials, shapes, structures, arrangements, or the like of the component parts to those presented below. The technical concept of the present invention allows for various modifications to be made within the technical scope defined by the claims.

Hereinafter, a semiconductor device according to an embodiment of the present invention will be described with reference to figures. In the present embodiment, a voltage-driven semiconductor device will be described as an example of the semiconductor device, and a gate driver device for a semiconductor device will be described as an example of a driving device for the semiconductor device.

First, an intelligent power module will be described with reference to FIG. 1 as a representative example of an inverter circuit including the semiconductor device according to the present embodiment.

Embodiment 1

FIG. 1 is a schematic diagram illustrating an example of a semiconductor device according to Embodiment 1 of the present invention.

An intelligent power module 1 illustrated in FIG. 1 is an inverter circuit which drives a three-phase electric motor 2 as the load, and the intelligent power module 1 is itself driven and controlled by a control circuit 3 such as a microcomputer.

The intelligent power module 1 includes a positive terminal P and negative terminals N(U), N(V), and N(W). The positive terminal P is connected to a positive line Lp of a main circuit power supply; the negative terminals N(U), N(V), and N(W) are connected to a negative line Ln of the main circuit power supply; and the positive line Lp and the negative line Ln are connected to the power supply (not illustrated in the figure), with a smoothing capacitor C connected between these lines. U-phase output terminal U, V-phase output terminal V, and W-phase output terminal W of the intelligent power module 1 are respectively connected to a U-phase winding, a V-phase winding, and a W-phase winding of the three-phase electric motor 2.

The intelligent power module 1 further includes a U-phase switching arm 1U connected between the positive terminal P and the negative terminal N(U), a V-phase switching arm 1V connected between the positive terminal P and the negative terminal N(V), and a W-phase switching arm 1W connected between the positive terminal P and the negative terminal N(W), and these U-phase switching arm 1U, V-phase switching arm 1V, and W-phase switching arm 1W are connected in parallel to form a bridge circuit.

In the U-phase switching arm 1U, a first semiconductor device forming an upper arm which is connected to the positive terminal P includes a switching device Su made of a wide-bandgap semiconductor and a freewheeling diode Du made of a narrow-bandgap semiconductor and connected in anti-parallel to the switching device Su. The switching device Su is an n-channel SiC metal-oxide-semiconductor field-effect transistor (SiC MOSFET), for example. The freewheeling diode Du is a soft recovery diode having a structure that reduces recovery noise and using an Si material with soft recovery characteristics. Due to the bandgap difference, the forward voltage VF of the freewheeling diode Du is less than the forward voltage VF of a body diode Su1 of the switching device Su constituted by the SiC MOSFET as a wide-bandgap semiconductor.

In the U-phase switching arm 1U, a second semiconductor device forming a lower arm which is connected to the negative terminal N(U) includes a switching device Sx made of a wide-bandgap semiconductor and a freewheeling diode Dx connected in anti-parallel to the switching device Sx. The switching device Sx is an n-channel SiC MOSFET, for example. The freewheeling diode Dx is an SiC Schottky barrier diode (SBD) having soft recovery characteristics and a structure that reduces recovery noise, for example.

The drain of the MOSFET constituting the switching device Su of the first semiconductor device is connected to the positive terminal P, the source of the MOSFET constituting the switching device Su is connected to the drain of the MOSFET constituting the switching device Sx, and the source of the MOSFET constituting the switching device Sx is connected to the negative terminal N(U). Moreover, the source of the MOSFET constituting the switching device Su is also connected to the U-phase output terminal U.

In the V-phase switching arm 1V, a first semiconductor device forming an upper arm which is connected to the positive terminal P includes a switching device Sv made of a wide-bandgap semiconductor and a freewheeling diode Dv made of a narrow-bandgap semiconductor and connected in anti-parallel to the switching device Sv. The switching device Sv is an n-channel SiC MOSFET, for example. The freewheeling diode Dv is a soft recovery diode using an Si material and having soft recovery characteristics, for example. Due to the bandgap difference, the forward voltage VF of the freewheeling diode Dv is less than the forward voltage VF of a body diode Sv1 of the switching device Sv constituted by semiconductor the SiC MOSFET as a wide-bandgap semiconductor.

"Wide-bandgap semiconductor" refers to a type of semiconductor known as a wide-bandgap semiconductor (a semiconductor with a bandgap greater than 1.2 eV, for example), and here, SiC is used as an example of such a semiconductor known as a wide-bandgap semiconductor. Similarly, "narrow-bandgap semiconductor" refers to a type of semiconductor known as a narrow-bandgap semiconductor (a semiconductor with a bandgap of 1.2 eV or less, for example), and here, Si is used as an example of such a semiconductor known as a narrow-bandgap semiconductor.

In the V-phase switching arm 1V, a second semiconductor device forming a lower arm which is connected to the negative terminal N(V) includes a switching device Sy made of a wide-bandgap semiconductor and a freewheeling diode Dy connected in anti-parallel to the switching device Sy. The switching device Sy is an n-channel SiC MOSFET, for example. The freewheeling diode Dy is an SiC SBD having soft recovery characteristics, for example.

The drain of the MOSFET constituting the switching device Sv is connected to the positive terminal P, the source of the MOSFET constituting the switching device Sv is connected to the drain of the MOSFET constituting the switching device Sy, and the source of the MOSFET constituting the switching device Sy is connected to the negative terminal N(V). Moreover, the source of the MOSFET constituting the switching device Sv is connected to the V-phase output terminal V.

In the W-phase switching arm 1W, a first semiconductor device forming an upper arm which is connected to the positive terminal P includes a switching device Sw made of a wide-bandgap semiconductor and a freewheeling diode Dw made of a narrow-bandgap semiconductor and connected in anti-parallel to the switching device Sw. The switching device Sw is an n-channel SiC MOSFET, for example. The freewheeling diode Dw is a soft recovery diode using an Si material and having soft recovery characteristics, for example. Due to the bandgap difference, the forward voltage VF of the freewheeling diode Dw is less than the forward voltage VF of a body diode Sw1 of the switching device Sw constituted by the SiC MOSFET as a wide-bandgap semiconductor.

In the W-phase switching arm 1W, a second semiconductor device forming a lower arm which is connected to the negative terminal N(W) includes a switching device Sz (which is a switching device made of a wide-bandgap semiconductor) and a freewheeling diode Dz connected in anti-parallel to the switching device Sz. The switching device Sz is an n-channel SiC MOSFET, for example. The freewheeling diode Dz is an SiC SBD having soft recovery characteristics, for example.

The drain of the MOSFET constituting the switching device Sw is connected to the positive terminal P, the source of the MOSFET constituting the switching device Sw is connected to the drain of the MOSFET constituting the switching device Sz, and the source of the MOSFET constituting the switching device Sz is connected to the negative terminal N(W). Moreover, the source of the MOSFET constituting the switching device Sw is connected to the W-phase output terminal W.

The gate of the MOSFET constituting the switching device Su is connected to a first gate driver circuit GDu1, the gate of the MOSFET constituting the switching device Sv is connected to a first gate driver circuit GDv1, and the gate of the MOSFET constituting the switching device Sw is connected to a first gate driver circuit GDw1. The gates of the MOSFET switching devices Sx, Sy, and Sz are connected to a second gate driver circuit GD2.

The first gate driver circuits GDu1, GDv1, and GDw1 and the second gate driver circuit GD2 are respectively connected to a power supply terminal Vcc connected to the positive side of a DC control power supply 4, and the negative side of the DC control power supply 4 is connected to a ground terminal GND of the control circuit 3 and has control power applied thereto.

The first gate driver circuits GDu1, GDv1, and GDw1 each include a reference voltage terminal Vs to which the sources of the corresponding switching devices Su, Sv, and Sw are respectively connected, and the voltages of these reference voltage terminals Vs serve as references for gate drive signals for the switching devices Su, Sv, and Sw.

The first gate driver circuits GDu1, GDv1, and GDw1 are connected to respectively corresponding power supply terminals VB(U), VB(V), and VB(W), to which power for driving the switching device Su in the U-phase upper arm, the switching device Sv in the V-phase upper arm, and the switching device Sw in the W-phase upper arm is input.

Furthermore, the first gate driver circuits GDu1, GDv1, and GDw1 are connected via respective input terminals IN to input terminals INH(U), INH(V), and INH(W), respectively, to which PWM signals for controlling the switching devices Su, Sv, and Sw are input from the control circuit 3. The second gate driver circuit GD2 is connected via input terminals $U_{IN}$, $V_{IN}$, and $W_{IN}$ to PWM input terminals INL(U), INL(V), and INL(W), respectively, to which PWM signals for controlling the switching devices Sx, Sy, and Sz are input from the control circuit 3. In accordance with the respective PWM signals from the control circuit 3, the first gate driver circuits GDu1, GDv1, and GDw1 and the second gate driver circuit GD2 respectively PWM-control the corresponding switching devices Su, Sv, and Sw as the first semiconductor devices and the corresponding switching devices Sx, Sy, and Sz as the second semiconductor devices. The gate driver circuits GDu1, GDv1, GDw1, and GD2 may collectively be referred to as a gate driver.

The negative terminals N(U), N(V), and N(W) of the intelligent power module 1 are connected to the GND terminal of the control circuit 3 via a shunt resistor Rs for detecting a U-phase current, a V-phase current, and a W-phase current. Moreover, the node between the negative terminals N(U), N(V), and N(W) and the shunt resistor Rs is connected to a short-circuit detection input terminal of the intelligent power module 1 and is also connected to a current detection input terminal of the control circuit 3.

Using current detection input values and current instruction values (not illustrated in the figure), the control circuit 3 implements a lower-clamped two-phase modulation control scheme for the switching devices Su, Sv, and Sw as the first semiconductor devices and the switching devices Sx, Sy, and Sz as the second semiconductor devices of the respective U-phase switching arm 1U, V-phase switching arm 1V, and W-phase switching arm 1W.

Here, the lower-clamped two-phase modulation control scheme will be described.

Figure 2A:
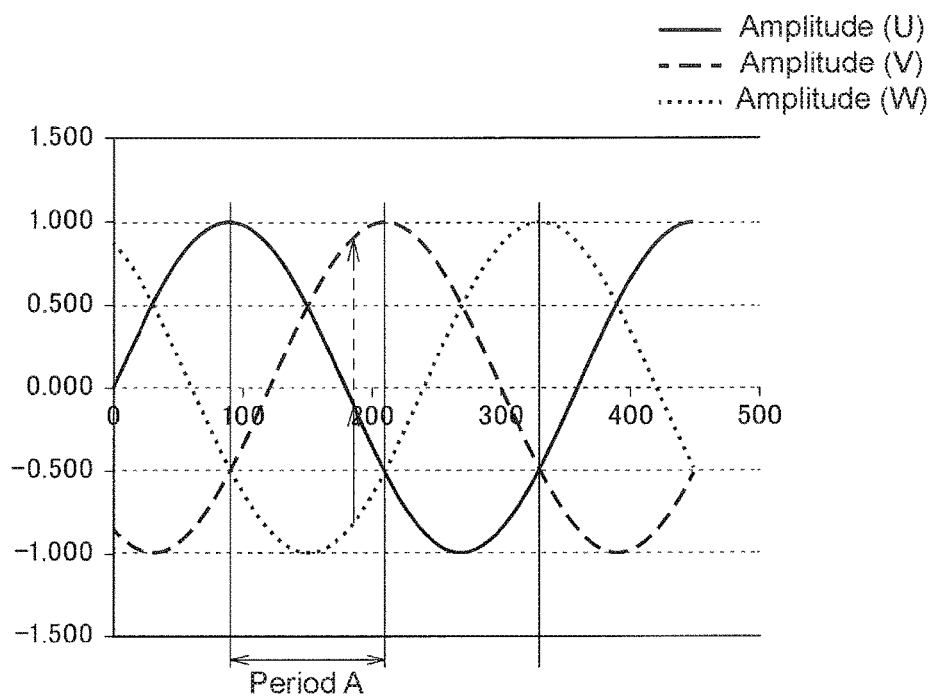
FIG. 2A is a waveform diagram illustrating examples of three-phase sinusoidal control scheme waveforms.

This lower-clamped two-phase modulation control scheme is a method of representing three-phase alternating current by, in a three-phase AC voltage, always looking from the phase with the lowest voltage at the other two phases. This allows three-phase alternating current to be represented as two-phase alternating current. In other words, during period A in the three-phase alternating current illustrated in FIG. 2A, the W-phase has the lowest voltage, and the three-phase alternating current is represented by fixing the voltage of the W-phase and using the voltages of the U-phase and V-phase as viewed from the W-phase. That is, although balanced three-phase current is defined by three-phase alternating current waveforms in which only the phases are different, balanced three-phase alternating current can actually be represented using just two alternating current waveforms.

Figure 2B:
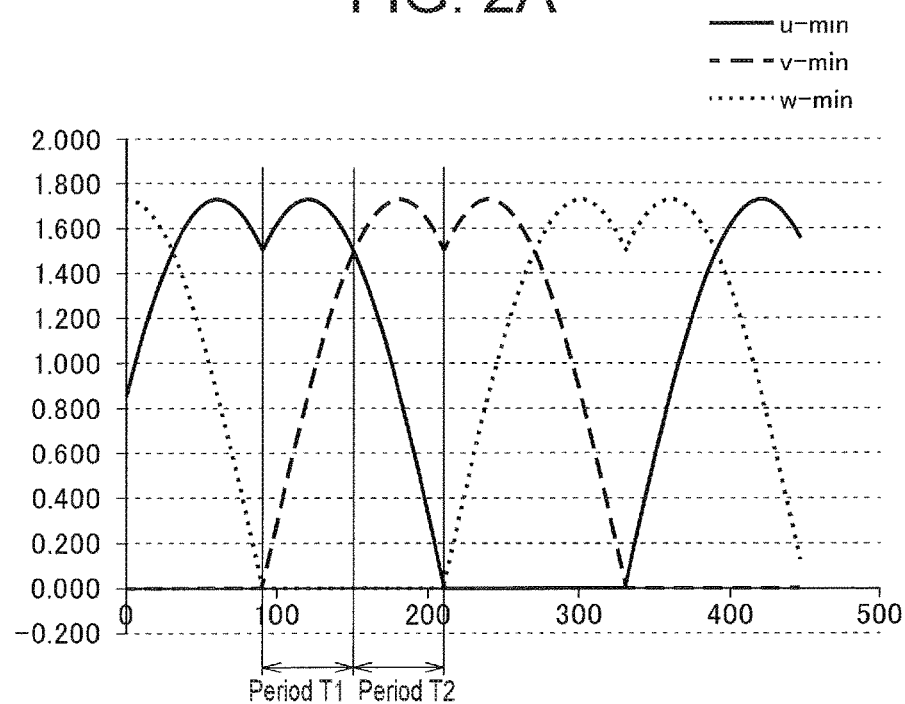
FIG. 2B is a waveform diagram illustrating examples of lower-clamped two-phase modulation control scheme waveforms.

As illustrated in FIG. 2B, when using this two-phase modulation scheme, the alternating current waveforms become saddle-shaped waveforms in which one of the phases is clamped to a zero voltage (indicated by "min" in the legend in the figure) every 120°. FIGS. 3B to 3G illustrate the drive waveforms from the control circuit 3 for the switching devices Su, Sv, and Sw and the switching devices Sx, Sy, and Sz in the switching arms 1U, 1V, and 1W of each phase used to achieve these saddle-shaped waveforms.

The operation of the control circuit 3 will be described for the periods T1 and T2 during which the W-phase is clamped to a zero voltage as illustrated in FIG. 2B.

Figure 3A:
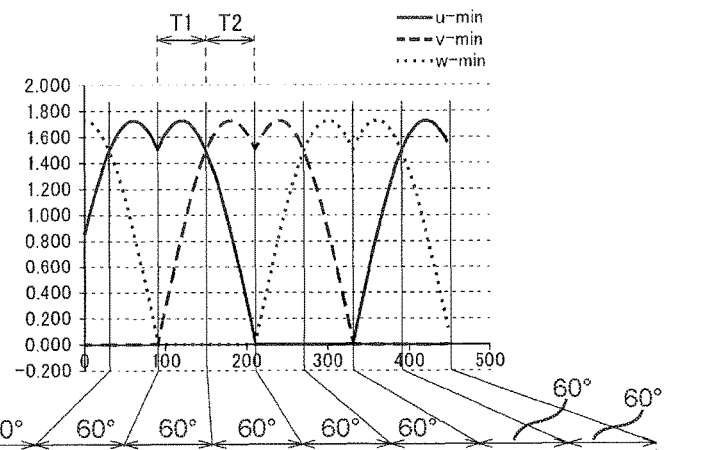
FIG. 3A is a waveform diagram illustrating examples of signal waveforms for each phase in the lower-clamped two-phase modulation scheme.
Figure 3B:
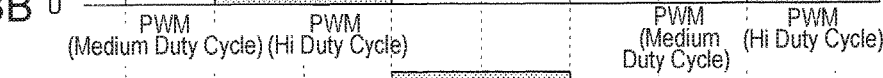
FIG. 3B is an example of drive waveforms for a switching device Su in a switching arm 1U in the lower-clamped two-phase modulation scheme.
Figure 3C:
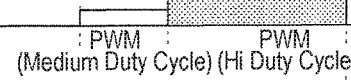
FIG. 3C is an example of drive waveforms for a switching device Sv in a switching arm 1V in the lower-clamped two-phase modulation scheme.
Figure 3D:
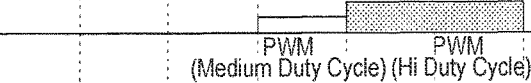
FIG. 3D is an example of drive waveforms for a switching device Sw in a switching arm 1W in the lower-clamped two-phase modulation scheme.

As illustrated in FIG. 3B, during the period T1, the switching device Su in the upper arm of the U-phase switching arm 1U is pulse-width modulation (PWM) driven at a Hi duty cycle in which the duty cycle is high (that is, in which the pulse width corresponding to when the switching device is ON is wide). As illustrated in FIG. 3C, the switching device Sv in the upper arm of the V-phase switching arm 1V is pulse-width modulation (PWM) driven at a medium duty cycle. Furthermore, as illustrated in FIG. 3D, the switching device Sw in the upper arm of the W-phase switching arm 1W is controlled to remain in the OFF state.

Figure 3E:
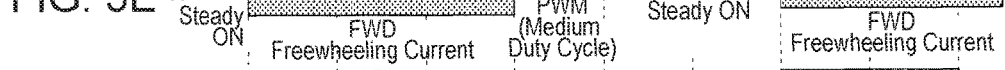
FIG. 3E is an example of drive waveforms for a switching device Sx in a switching arm 1U in the lower-clamped two-phase modulation scheme.
Figure 3F:
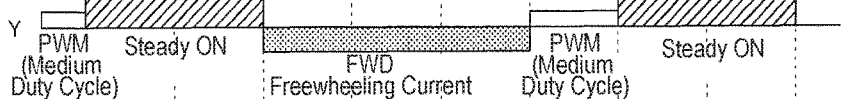
FIG. 3F is an example of drive waveforms for a switching device Sy in a switching arm 1V in the lower-clamped two-phase modulation scheme.
Figure 3G:
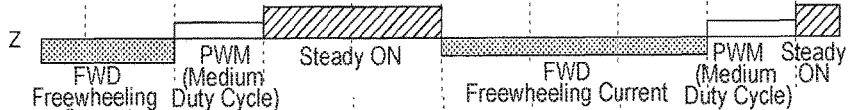
FIG. 3G is an example of drive waveforms for a switching device Sz in a switching arm 1W in the lower-clamped two-phase modulation scheme.

On the other hand, as illustrated in FIG. 3E, the switching device Sx in the lower arm of the U-phase switching arm 1U is in the OFF state, and freewheeling current flows through the freewheeling diode Dx while the switching device Su in the upper arm is OFF. Similarly, as illustrated in FIG. 3F, when the switching device Sy in the lower arm of the V-phase switching arm 1V is in the OFF state, freewheeling current flows through the freewheeling diode Dy while the switching device Sv in the upper arm is OFF. Furthermore, as illustrated in FIG. 3G, the switching device Sz in the lower arm of the W-phase switching arm 1W is controlled to remain steady in the ON state.

Figure 4A:
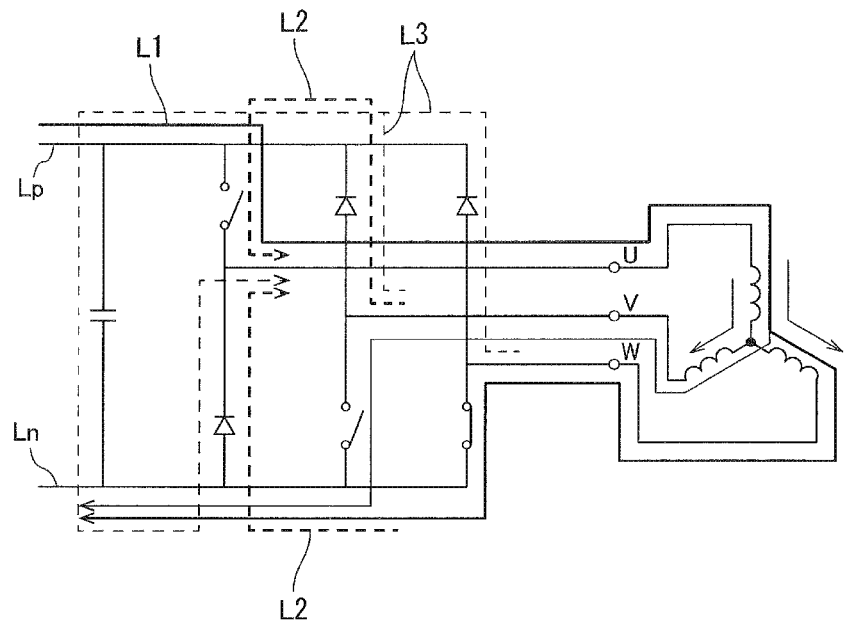
FIG. 4A is an explanatory drawing illustrating power supply paths during a conduction period T1 of the W-phase in FIG. 2B.

Therefore, during the period T1, the current path in the three-phase electric motor 2 and the intelligent power module 1 which functions as the inverter circuit allows current to flow as illustrated by the solid line L1 in FIG. 4A. In other words, motor current flows from the positive line Lp through the switching device Su in the U-phase switching arm 1U, through the U-phase winding of the three-phase electric motor 2, from the neutral point through both the V-phase winding and the W-phase winding and through the switching device Sy or the freewheeling diode Dy (the current flowing in a manner that reduces freewheeling current in the freewheeling diode Dy; the same applies below) in the V-phase switching arm 1V as well as through the switching device Sz in the W-phase switching arm 1W, and to the negative line Ln.

Meanwhile, freewheeling current from the three-phase electric motor 2 (when the switching device Su in the U-phase upper arm is OFF) flows as illustrated by the bold dashed lines L2. In other words, freewheeling current from the V-phase winding of the three-phase electric motor 2 flows through the freewheeling diode Dv in the upper arm of the V-phase switching arm 1V, through the positive line Lp, through the switching device Su in the U-phase switching arm 1U, and towards the U-phase winding of the three-phase electric motor 2. Freewheeling current from the W-phase winding of the three-phase electric motor 2 flows through the switching device Sz in the W-phase switching arm 1W, through the negative line Ln, through the freewheeling diode Dx in the lower arm of the U-phase switching arm 1U, and towards the U-phase winding of the three-phase electric motor 2.

Furthermore, when all of the semiconductor devices are in the OFF state, freewheeling current from the three-phase electric motor 2 flows as illustrated by the thin dashed lines L3 in FIG. 4A. In other words, freewheeling current from the V-phase winding of the three-phase electric motor 2 flows through the freewheeling diode Dv in the upper arm of the V-phase switching arm 1V, through the positive line Lp, through the smoothing capacitor C, through the negative line Ln, through the freewheeling diode Dx in the lower arm of the U-phase switching arm 1U, and to the U-phase winding of the three-phase electric motor 2. Moreover, freewheeling current from the W-phase winding of the three-phase electric motor 2 flows through the freewheeling diode Dw in the upper arm of the W-phase switching arm 1W, through the positive line Lp, through the smoothing capacitor C, through the negative line Ln, through the freewheeling diode Dx in the lower arm of the U-phase switching arm 1U, and to the U-phase winding of the three-phase electric motor 2.

During the period T2, the control circuit 3 controls the intelligent power module 1 as illustrated in FIGS. 3B to 3G. In other words, as illustrated in FIG. 3B, the switching device Su in the upper arm of the U-phase switching arm 1U is controlled to remain in the OFF state. Moreover, as illustrated in FIG. 3C, the switching device Sv in the upper arm of the V-phase switching arm 1V is pulse-width modulation controlled at a Hi duty cycle having a relatively wide pulse width. Furthermore, as illustrated in FIG. 3D, the switching device Sw in the upper arm of the W-phase switching arm 1W is controlled to remain in the OFF state.

Meanwhile, as illustrated in FIG. 3E, the switching device Sx in the lower arm of the U-phase switching arm 1U is pulse-width modulation (PWM) controlled at a medium duty cycle. As illustrated in FIG. 3F, the switching device Sy in the lower arm of the V-phase switching arm 1V is controlled to remain in the OFF state, and freewheeling current flows through the freewheeling diode Dy. Furthermore, as illustrated in FIG. 3G, the switching device Sz in the lower arm of the W-phase switching arm 1W is controlled to remain steady in the ON state.

Figure 4B:
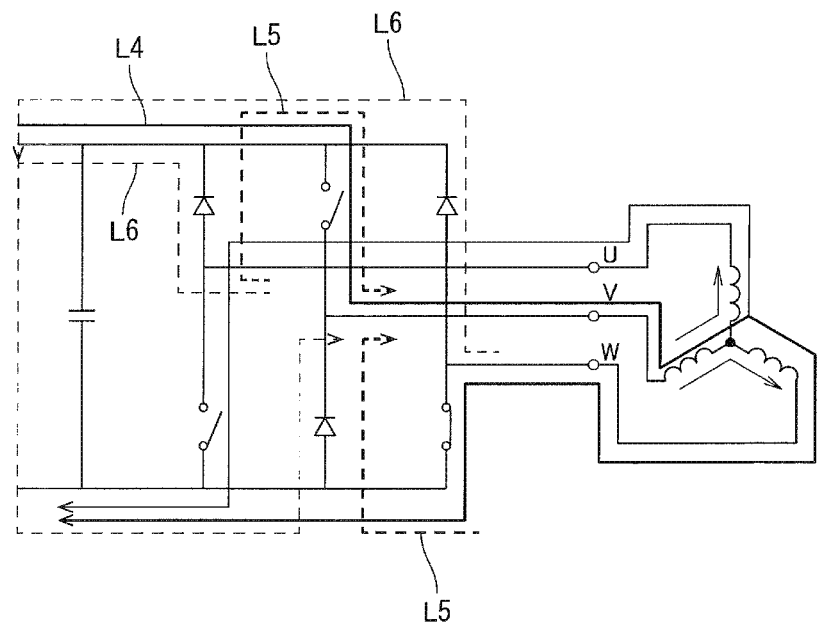
FIG. 4B is an explanatory drawing illustrating power supply paths during a period T2 of the W-phase in FIG. 2B

Therefore, during the period T2, the current path in the intelligent power module 1 and the three-phase electric motor 2 allows current to flow as illustrated by the solid line L4 in FIG. 4B. In other words, while the switching device Sx in the U-phase lower arm is ON, motor current flows from the positive line Lp through the switching device Sv in the V-phase switching arm 1V, through the V-phase winding of the three-phase electric motor 2, from the neutral point through the U-phase winding and the switching device Sx as well as through the W-phase winding, through the switching device Sx in the U-phase switching arm 1U as well as the switching device Sz in the W-phase switching arm 1W, and to the negative line Ln.

While the switching device Sx in the U-phase lower arm is OFF, freewheeling current from the three-phase electric motor 2 (from when the switching device Sv in the V-phase upper arm is OFF) flows as illustrated by the bold dashed lines L5. In other words, freewheeling current from the U-phase winding of the three-phase electric motor 2 flows through the freewheeling diode Du in the upper arm of the U-phase switching arm 1U, through the positive line Lp, through the switching device Sv in the V-phase switching arm 1V, and towards the V-phase winding of the three-phase electric motor 2. Freewheeling current from the W-phase winding of the three-phase electric motor 2 flows through the switching device Sz in the W-phase switching arm 1W, through the negative line Ln, through the freewheeling diode Dx in the lower arm of the U-phase switching arm 1U, and towards the V-phase winding of the three-phase electric motor 2.

Furthermore, when all of the semiconductor devices are in the OFF state, freewheeling current from the three-phase electric motor 2 flows as illustrated by the thin dashed lines L6 in FIG. 4B. In other words, freewheeling current from the U-phase winding of the three-phase electric motor 2 flows through the freewheeling diode Du in the upper arm of the U-phase switching arm 1U, through the positive line Lp, through the smoothing capacitor C, through the negative line Ln, through the freewheeling diode Dy in the lower arm of the V-phase switching arm 1V, and to the V-phase winding of the three-phase electric motor 2. Freewheeling current from the W-phase winding of the three-phase electric motor 2 flows through the freewheeling diode Dw in the upper arm of the W-phase switching arm 1W, through the positive line Lp, through the smoothing capacitor C, through the negative line Ln, through the freewheeling diode Dy in the lower arm of the V-phase switching arm 1V, and to the V-phase winding of the three-phase electric motor 2.

As illustrated in FIG. 2B, the U-phase two-phase modulation waveform increases from the beginning of the period T1, reaches a peak value, begins decreasing, and then continues decreasing during the period T2 and decreases to a minimum voltage (the voltage denoted as −0.000 in the figure; hereinafter, simply "zero voltage"). In contrast, as illustrated in FIG. 2B, the V-phase two-phase modulation waveform begins increasing from a zero voltage at the beginning of the period T1 and continues increasing during the period T2 until reaching a peak value and beginning to decrease. Furthermore, as illustrated in FIG. 2B, the W-phase two-phase modulation waveform maintains a zero voltage during the period T1 and the period T2.

Ultimately, as illustrated in FIG. 2B, the U-phase two-phase modulation waveform, the V-phase two-phase modulation waveform, and the W-phase two-phase modulation waveform respectively have the same waveform shape, which has a saddle-shaped waveform on the upper side and maintains a zero voltage for a duration of 120° at electrical angles of every 240° ($2\pi/3$), and there is a phase difference of 120° between the phases.

Figure 3H:
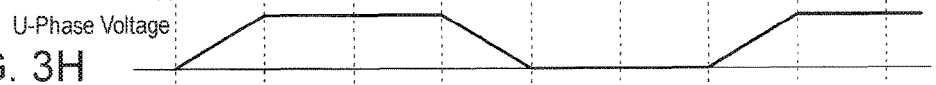
FIG. 3H is an example of transition of U-phase voltage in the lower-clamped two-phase modulation scheme.
Figure 3I:
FIG. 3I is an example of transition of U-phase current in the lower-clamped two-phase modulation scheme.

When this type of two-phase modulation control scheme is implemented for the switching devices Su, Sv and Sw and the switching devices Sx, Sy and Sz included in the intelligent power module 1, the U-phase voltage, for example, takes a trapezoidal waveform shape, as illustrated in FIG. 3H, and the U-phase current takes a form similar to a sine wave, as illustrated in FIG. 3I. Note that FIGS. 3H and 3I correspond to a case in which the Hi duty cycle and the medium duty cycle described above are fixed.

In this two-phase modulation control scheme, one of the switching devices Sx, Sy and Sz in the lower arms of the switching arms 1U, 1V and 1W always remains in the ON state instead of switching, thereby making it possible to reduce switching loss by a proportional amount in comparison with when using a three-phase sinusoidal drive scheme. Moreover, the power utilization rate is high, and it is possible to make the maximum line voltage of the three-phase electric motor 2 (the load) equal to the terminal voltage Vdc of the smoothing capacitor C.

In contrast, if the three-phase electric motor illustrated in FIG. 1 were to be driven using a conventional three-phase sinusoidal drive control scheme, each of the switching devices in both the upper arms and lower arms of the three phases of switching arms would always be pulse-width modulation (PWM) controlled. As a result, in such a three-phase sinusoidal drive scheme, switching loss would be large, power utilization rate would be low, and the maximum line voltage of the three-phase electric motor (the load) would only be $\sqrt{3}Vdc/2=0.86Vdc$ relative to the terminal voltage Vdc of the smoothing capacitor C.

Therefore, implementing a two-phase modulation control scheme for the intelligent power module 1 (which serves as an inverter) makes it possible to reduce switching loss relative to a three-phase sinusoidal control scheme.

As described above, when implementing a two-phase modulation control scheme for the intelligent power module 1, a lower-clamped two-phase modulation control scheme in which one of the lower arm switching devices Sx, Sy and Sz is always in the ON state instead of switching and the saddle-shaped waveform is formed on the upper side is used. Instead, an upper-clamped two-phase modulation control scheme in which one of the upper arm switching devices Su, Sv and Sw is always in the ON state instead of switching and the saddle-shaped waveform is formed on the lower side may be used. See Embodiment 2 below.

In the present embodiment, using the intelligent power module 1 illustrated in FIG. 1 for the lower-clamped two-phase modulation control scheme makes it possible to further reduce switching loss.

In other words, in the switching arms 1U, 1V and 1W of each phase of the intelligent power module 1 illustrated in FIG. 1, wide-bandgap semiconductor SiC MOSFETs are used for the switching devices Su, Sv and Sw of the first semiconductor devices, and freewheeling diodes made of an Si material are used for the narrow-bandgap semiconductor freewheeling diodes Du, Dv and Dw of the first semiconductor devices. Moreover, the forward voltage VF of the freewheeling diodes Du, Dv and Dw of the first semiconductor devices is less than the forward voltage VF of the body diodes Su1, Sv1 and Sw1 of the switching devices Su, Sv and Sw made of a wide-bandgap semiconductor.

Here, when current flows from a phase on the high voltage side to a phase on the low voltage side that is not at a zero voltage, as in the period T2 in FIGS. 3A to 3I, for example, the switching device in the lower arm is PWM-controlled in order to determine the voltage of the phase on the low voltage side, and when the switching device in the lower arm is switched OFF, freewheeling current flows to the freewheeling diode in the upper arm. Because the duration of the period T2 is short (⅙ the period of the alternating current), switching noise during recovery has more importance than switching loss for the freewheeling diode in the upper arm. Moreover, the turn-on characteristics of the upper arm are largely determined by the recovery characteristics of the freewheeling diode in the lower arm. Furthermore, although when using external freewheeling diodes it is possible to use diodes having soft recovery characteristics, for example, because such diodes can be manufactured independently, it is difficult to achieve soft recovery characteristics in the body diodes of MOSFETs.

As illustrated in FIG. 1, in order to make freewheeling current reliably flow to the external Si FWDs (Du, Dv and Dw) during recovery operation, diodes with a lower forward voltage VF than the body diodes Su1, Sv1 and Sw1 of the switching devices Su, Sv and Sw are used. Moreover, wide-bandgap semiconductor SiC SBDs having soft recovery characteristics are used for the freewheeling diodes in the lower arms, which reduces freewheeling current flowing through the body diodes of the switching devices in the lower arms and thereby reduces noise.

Therefore, during the period T2 and the like illustrated in FIGS. 3A to 3I, for example, it is possible to avoid flow of freewheeling current through the body diodes of the switching devices in the upper arms, thereby making it possible to reduce recovery noise resulting from such flow of freewheeling current through the body diodes of the switching devices. Moreover, the freewheeling diodes in the upper arms are soft recovery diodes having a structure which reduces recovery noise, thereby making it possible to reduce recovery noise in the freewheeling diodes as well. Furthermore, the switching devices in the upper arms as well as the switching devices and the freewheeling diodes in the lower arms are made of an SiC material in order to focus on switching loss, thereby making it possible to reduce the total loss of the overall intelligent power module 1.

Figure 5:
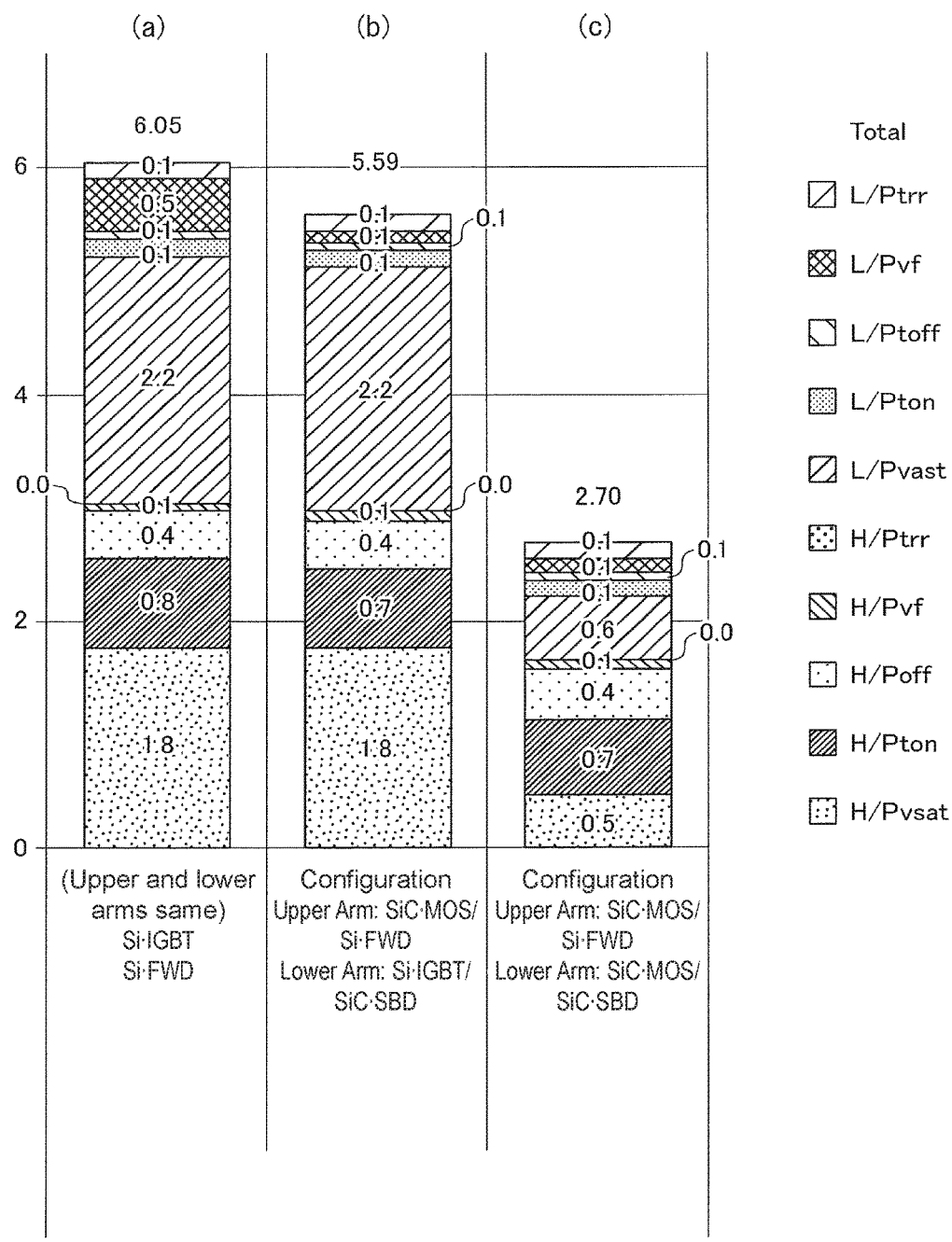
FIG. 5 illustrates the results of a loss simulation for a moderate load.
Figure 6:
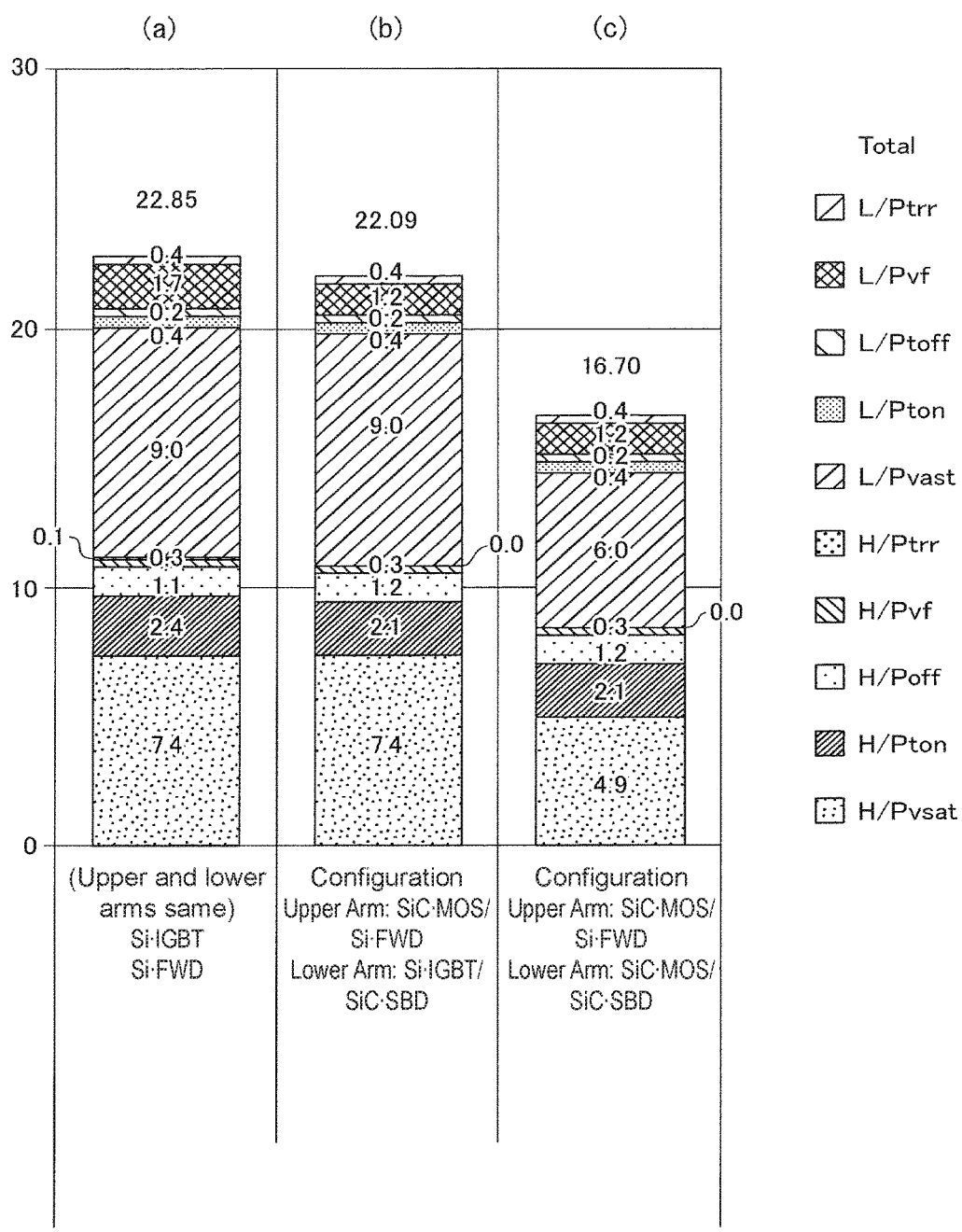
FIG. 6 illustrates the results of a loss simulation for a rated load.

FIGS. 5 and 6 show the loss percentages and total loss in the upper arms and the lower arms when driven using the lower-clamped two-phase modulation control scheme, where FIG. 5 shows the results of simulating driving under a moderate load (output current Io=2 Arms) and FIG. 6 shows the results of simulating driving under a rated load (output current Io=6 Arms). FIGS. 5 and 6 show the losses for (a) an intelligent power module in which the same type of semiconductor devices are used in the upper and lower arms (hereinafter, Comparison Example 1), (b) an intelligent power module in which SiC MOSFETs and Si FWDs are used in the upper arms and Si IGBTs and SiC SBDs are used in the lower arms (hereinafter, Comparison Example 2), and (c) the intelligent power module 1 illustrated in FIG. 1, in which SiC MOSFETs and Si FWDs are used in the upper arms and SiC MOSFETs and SiC SBDs are used in the lower arms.

When driven using a two-phase modulation control scheme, the percentage of conduction loss in the lower arms increases, and therefore in comparison with the intelligent power modules of Comparison Example 1 and Comparison Example 2, the intelligent power module 1 according to one embodiment of the present invention exhibits less inbalance in a loss and thereby achieves lower loss. Moreover, as shown in FIGS. 5 and 6, this low loss effect is particularly pronounced when operating under moderate load.

In FIGS. 5 and 6, H/Pvsat represents the conduction loss of the switching devices in the upper arms, H/Pton represents the switching loss of the switching devices in the upper arms when switched ON, H/Ptoff represents the switching loss of the switching devices in the upper arms when switched OFF, H/Pvf represents the conduction loss of the freewheeling diodes in the upper arms, and H/Ptrr represents the recovery loss of freewheeling diodes in the upper arms. L/Pvsat represents the conduction loss of the switching devices in the lower arms, L/Pton represents the switching loss of the switching devices in the lower arms when switched ON, L/Ptoff represents the switching loss of the switching devices in the lower arms when switched OFF, L/Pvf represents the conduction loss of the freewheeling diodes in the lower arms, and L/Ptrr represents the recovery loss of freewheeling diodes in the lower arms. "Total" represents the total loss.

Embodiment 2

Next, Embodiment 2 of the present invention will be described.

In Embodiment 2 of the present invention, an intelligent power module 1a is driven using an upper-clamped two-phase modulation control scheme, and the configuration of the upper and lower arms of the intelligent power module 1 according to Embodiment 1 is reversed.

Figure 7:
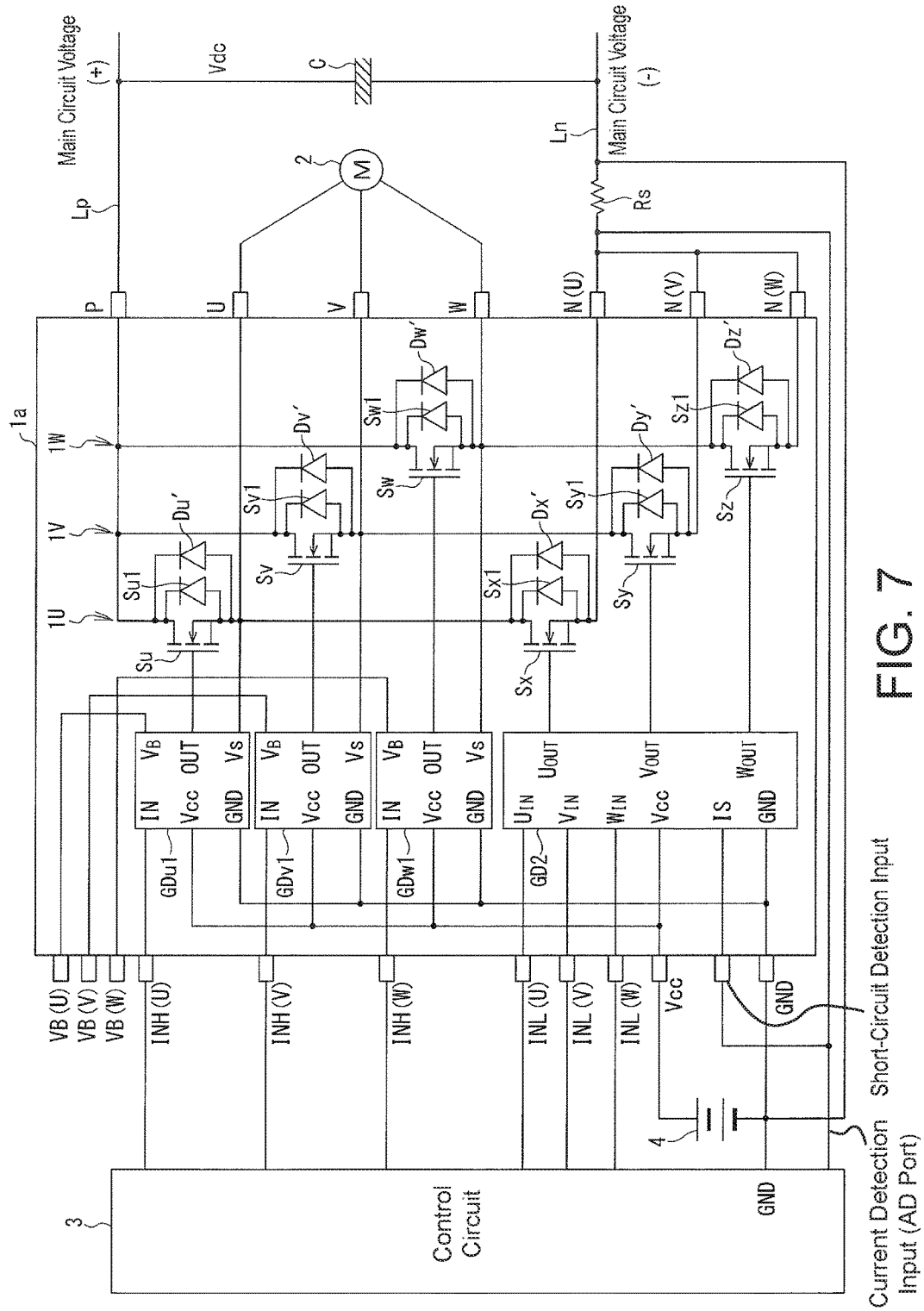
FIG. 7 is a circuit diagram illustrating an example of an intelligent power module according to Embodiment 2 of the present invention.

In other words, as illustrated in FIG. 7, in the intelligent power module 1a according to Embodiment 2, the configuration of the U-phase switching arm 1U, V-phase switching arm 1V, and W-phase switching arm 1W is different from that in the intelligent power module 1 according to Embodiment 1.

In the U-phase switching arm 1U of the intelligent power module 1a according to Embodiment 2, the upper arm connected to the positive terminal P includes a switching device Su made of a wide-bandgap semiconductor and constituted by an n-channel SiC MOSFET, for example, as well as a freewheeling diode Du' connected in anti-parallel to this switching device Su. The freewheeling diode Du' is an SiC Schottky barrier diode (SBD) having soft recovery characteristics. In the U-phase switching arm 1U, the lower arm connected to the negative terminal N(U) includes a switching device Sx made of a wide-bandgap semiconductor and constituted by an n-channel SiC MOSFET, for example, as well as a freewheeling diode Dx' connected in anti-parallel to this switching device Sx. The freewheeling diode Dx' is constituted by a narrow-bandgap semiconductor having soft recovery characteristics such as a soft recovery diode made of an Si material, for example, and the forward voltage VF of the freewheeling diode Dx' is less than the forward voltage VF of a body diode Sx1 of the wide-bandgap semiconductor switching device Sx.

Similarly, in the V-phase switching arm 1V and the W-phase switching arm 1W, the upper arms include switching devices Sv and Sw made of a wide-bandgap semiconductor and constituted by n-channel SiC MOSFETs, for example, as well as freewheeling diodes Dv' and Dw' connected in anti-parallel to the switching devices Sv and Sw. The freewheeling diodes Dv' and Dw' are SiC SBDs having soft recovery characteristics. The lower arms connected to the negative terminals N(V) and N(W) include switching devices Sy and Sz made of a wide-bandgap semiconductor and constituted by n-channel SiC MOSFETs, for example, as well as freewheeling diodes Dy' and Dz' connected in anti-parallel to the switching devices Sy and Sz. The freewheeling diodes Dy' and Dz' are constituted by a narrow-bandgap semiconductor having soft recovery characteristics such as soft recovery diodes made of an Si material, for example, and the forward voltage VF of the freewheeling diodes Dy' and Dz' is less than the forward voltage VF of body diodes Sy1 and Sz1 of the wide-bandgap semiconductor switching devices Sy and Sz.

In this upper-clamped two-phase modulation scheme, opposite to in the lower-clamped two-phase modulation scheme, the switching devices in the upper arms exhibit high conduction loss, and the switching devices in the lower arms exhibit high switching loss. Moreover, the freewheeling diodes in the upper arms exhibit high switching loss, while the freewheeling diodes in the lower arms exhibit substantially no conduction loss.

In the lower arm switching devices (which exhibit high switching loss) of the intelligent power module 1a according to Embodiment 2, the freewheeling diodes connected in anti-parallel to these switching devices have soft recovery characteristics and have a forward voltage VF lower than the forward voltage VF of the body diodes of the switching devices. As a result, it is possible to reliably make freewheeling current flow to the freewheeling diodes during recovery operation. In other words, this makes it possible to avoid flow of freewheeling current through the body diodes of the switching devices during recovery operation, thereby making it possible to reduce noise resulting from such flow of freewheeling current through the body diodes of the switching devices. Thus, it is possible to achieve the same advantageous effects as in Embodiment 1 here as well.

As described above, in the present embodiments, using the intelligent power module 1 illustrated in FIG. 1 in the case of the lower-clamped two-phase modulation control scheme or using an intelligent power module 1a illustrated in FIG. 7 in the case of the upper-clamped two-phase modulation control scheme, it becomes possible to further reduce the switching loss.

Although the embodiments above were described using examples in which a semiconductor made of an SiC material is used as the wide-bandgap semiconductor and a semiconductor made of an Si material is used as the narrow-bandgap semiconductor, the present invention is not limited to this example. For example, a semiconductor known to be wide-bandgap semiconductor such as gallium nitride (GaN) or diamond (C) can be used, and similarly, another semiconductor known to be a narrow-bandgap semiconductor can be used instead of the semiconductor made of an Si material.

Moreover, although in the embodiments above the semiconductor devices according to the embodiments of the present invention were described as being applied to an inverter circuit for driving the three-phase electric motor 2, the present invention is not limited to use for driving and controlling the three-phase electric motor 2 and can be applied to any device that drives a circuit in which three phases of two series-connected semiconductor devices are connected in parallel by implementing a two-phase modulation scheme.

Although the present invention was described with reference to several specific embodiments above, these descriptions do not limit the invention. Upon referring to the descriptions of the present invention, various modification examples of the disclosed embodiments as well as other embodiments of the present invention would be obvious to a person skilled in the art. Therefore, the claims should be understood to encompass such modification examples and embodiments which are also included within the scope and spirit of the present invention.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A power device for driving an inductive load to be connected thereto, comprising: a bridge circuit in which three switching arms corresponding to three phases are connected in parallel, each switching arm including a first semiconductor device in one of an upper arm and a lower arm thereof and a second semiconductor device in the other of the upper arm and the lower arm that is connected in series to the first semiconductor device; and a gate driver that switches ON and OFF the first semiconductor devices and the second semiconductor devices of the respective switching arms of the bridge circuit so as to drive the inductive load to be connected to the bridge circuit, wherein each of the first semiconductor devices includes a first switching device made of a wide-bandgap semiconductor and a freewheeling diode that is made of a narrow-bandgap semiconductor and is connected in anti-parallel to the first switching device, wherein each of the second semiconductor devices includes a second switching device made of a wide-bandgap semiconductor and a freewheeling diode connected in anti-parallel to the second switching device, wherein the gate driver is configured to turn ON and OFF the respective first and second switching devices so as to drive the inductive load in a two-phase modulation scheme in which in every $2\pi/3$ phase period, one of phase voltages of three-phase voltages applied to the inductive load is alternately fixed to a constant voltage by controlling one of the upper arm and the lower arm of each switching arm of the bridge circuit to an ON state and controlling the other of the upper arm and the lower arm of each switching arm of the bridge circuit to an OFF state, wherein the freewheeling diode in each of the second semiconductor devices is made of a wide-bandgap semiconductor, and wherein in performing the two-phase modulation scheme, the gate driver is configured to drive the first and second switching devices such that in every $2\pi/3$ phase period, the second switching device in one of the switching arms remains ON.

2. The power device according to claim 1, wherein the freewheeling diode in each of the second semiconductor devices is made of a wide-bandgap semiconductor.

3. The power device according to claim 1, wherein in each of the first semiconductor devices, the first switching device includes a body diode as a parasitic element, and a forward voltage of the freewheeling diode in the first semiconductor device is less than a forward voltage of the body diode.

4. The power device according to claim 1, wherein the freewheeling diode in each of the first semiconductor devices is made of an Si material and the freewheeling diode in each of the second semiconductor devices is made of an SiC material.

5. The power device according to claim 1, wherein the first and second switching devices in each of the switching arms are SiC MOSFETs.

6. The power device according to claim 1, wherein the freewheeling diode in each of the second semiconductor devices is an SiC Schottky barrier diode (SBD).

7. The power device according to claim 1, wherein the freewheeling diode in each of the second semiconductor devices is a Schottky barrier diode (SBD) made of a wide-bandgap semiconductor.

8. The power device according to claim 1, further comprising a control circuit connected to the gate driver, the control circuit providing pulse width modulation (PWM) signals to the gate driver so as to drive the inductive load in the two-phase modulation scheme.

* * * * *